(12) United States Patent
Huang et al.

(10) Patent No.: US 9,761,491 B1
(45) Date of Patent: Sep. 12, 2017

(54) SELF-ALIGNED DEEP CONTACT FOR VERTICAL FET

(71) Applicant: GLOBALFOUNDRIES INC., Grand Cayman (KY)

(72) Inventors: Haigou Huang, Rexford, NY (US); Xusheng Wu, Ballston Lake, NY (US); John H. Zhang, Altamont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/370,404

(22) Filed: Dec. 6, 2016

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 21/336* | (2006.01) |
| *H01L 21/8234* | (2006.01) |
| *H01L 21/768* | (2006.01) |
| *H01L 27/088* | (2006.01) |
| *H01L 29/786* | (2006.01) |
| *H01L 29/423* | (2006.01) |
| *H01L 29/49* | (2006.01) |
| *H01L 23/535* | (2006.01) |

(52) U.S. Cl.
CPC .. *H01L 21/76897* (2013.01); *H01L 21/76805* (2013.01); *H01L 21/823437* (2013.01); *H01L 21/823475* (2013.01); *H01L 21/823487* (2013.01); *H01L 23/535* (2013.01); *H01L 27/088* (2013.01); *H01L 29/42392* (2013.01); *H01L 29/4966* (2013.01); *H01L 29/78642* (2013.01)

(58) Field of Classification Search
CPC ............. H01L 21/76897; H01L 27/088; H01L 29/78642
USPC .................................. 257/329, 288; 438/197
See application file for complete search history.

(56) References Cited

U.S. PATENT DOCUMENTS

| | | | |
|---|---|---|---|
| 9,190,466 | B2 | 11/2015 | Basker et al. |
| 9,245,885 | B1 | 1/2016 | Xie et al. |
| 9,466,723 | B1 | 10/2016 | Huang et al. |
| 2017/0125411 | A1* | 5/2017 | Yu ........................ H01L 27/0886 |
| 2017/0140996 | A1* | 5/2017 | Lin .................. H01L 21/823821 |
| 2017/0154823 | A1* | 6/2017 | Tseng ............... H01L 21/823481 |

* cited by examiner

*Primary Examiner* — David S Blum
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to a self-aligned deep contact for a vertical field effect transistor (VFET) and methods of manufacture. The structure includes a plurality of fin structures, a first contact landing on a substrate material between a first set of fin structures of the plurality of fin structures, sidewalls of the first contact being in direct contact with an insulator material of the first set of the fin structures, and a second contact landing on a work function material between a second set of fin structures of the plurality of fin structures, sidewalls of the second contact being in direct contact with the insulator material of the second set of the fin structures.

20 Claims, 3 Drawing Sheets

US 9,761,491 B1

SELF-ALIGNED DEEP CONTACT FOR VERTICAL FET

FIELD OF THE INVENTION

The present disclosure relates to semiconductor structures and, more particularly, to self-aligned deep contacts for a vertical field effect transistor (FET) and methods of manufacture.

BACKGROUND

An increase in an operation frequency and power density of a semiconductor device requires a decrease in a unit cell dimension of the semiconductor device. An approach used to reduce gate length and the unit cell size is to orient the current flow in a vertical direction using a vertical field effect transistor (FET).

The vertical FET has advantages over a standard lateral FET for high frequency, high power applications. In particular, the vertical FET eliminates parasitic capacitance and conductance from a substrate and also provides higher breakdown voltage by passing the current flow in a bulk of the material instead of the device surface. Further, since the ohmic contacts and device channel are aligned vertically, the current density per unit of surface area is much higher than in a lateral FET. Thus, for the same surface area, vertical FETs will have higher power than lateral FETs.

A vertical FET is considered as a key device structure for smaller technology nodes, e.g., 5 nm nodes and beyond. In the vertical FET, a fin can be used as a channel. Further, the source, drain, and gate are transferred from planar to vertical. However, both the source and drain contact and the contact on gate heights significantly increase in a vertical FET. The increased height will increase contact resistance and in etching selectivity on silicon nitride.

SUMMARY

In an aspect of the disclosure, a structure includes a plurality of fin structures, a first contact landing on a substrate material between a first set of fin structures of the plurality of fin structures, sidewalls of the first contact being in direct contact with an insulator material of the first set of the fin structures, and a second contact landing on a work function material between a second set of fin structures of the plurality of fin structures, sidewalls of the second contact being in direct contact with the insulator material of the second set of the fin structures.

In an aspect of the disclosure, a structure includes a plurality of fin structures including a substrate material and an epitaxially grown material on the substrate material, a source or drain contact landing on the substrate material between a first set of fin structures of the plurality of fin structures, and a gate contact landing on a work function material between a second set of fin structures of the plurality of fin structures, an insulator material in direct contact with the source or drain contact and the first set of fin structures and the gate contact and the second set of fin structures.

In an aspect of the disclosure, a method includes forming a plurality of vertical fin structures, forming a first contact landing on a substrate material between a first set of fin structures of the plurality of fin structures, sidewalls of the first contact being in direct contact with an insulator material of the first set of the fin structures, and forming a second contact landing on a work function material between a second set of fin structures of the plurality of fin structures, sidewalls of the second contact being in direct contact with the insulator material of the second set of the fin structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a vertical field effect transistor (FET) and methods of manufacture. More specifically, the present disclosure is directed to self-aligned deep contacts for a vertical FET. The self-aligned deep contact allows for full replacement deep contact flow for 5 nm technology nodes and beyond. Moreover, the self-aligned contact and gate contact can be fabricated with the same mask, significantly reducing manufacturing time and expense. In addition, the fabrication processes for source to drain contact can use a wet etching reactive ion etching (RIE) process, replacing current dry etching process. Also, there are low requirements on source and drain contact RIE.

The vertical field effect transistor (VFET) of the present disclosure can be manufactured in a number of ways using a number of different tools. In general, though, the methodologies and tools are used to form structures with dimensions in the micrometer and nanometer scale. The methodologies, i.e., technologies, employed to manufacture the VFET of the present disclosure have been adopted from integrated circuit (IC) technology. For example, the structures are built on wafers and are realized in films of material patterned by photolithographic processes on the top of a wafer. In particular, the fabrication of the VFET uses three basic building blocks: (i) deposition of thin films of material on a substrate, (ii) applying a patterned mask on top of the films by photolithographic imaging, and (iii) etching the films selectively to the mask.

Figure 1:
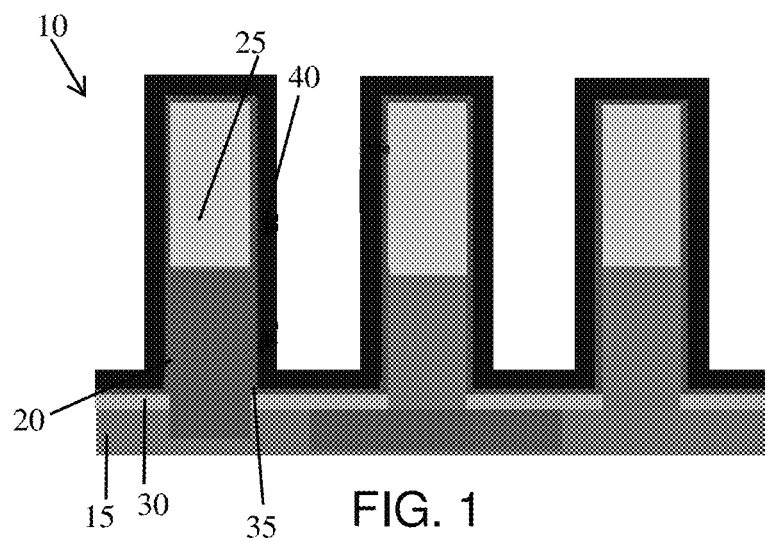
FIG. 1 shows a fin structure (vertical FET) and respective fabrication processes in accordance with aspects of the present disclosure.

FIG. 1 shows a structure and respective fabrication processes in accordance with aspects of the present disclosure. More specifically, the structure 10 of FIG. 1 includes a plurality of fin structures 20 which are composed of substrate material 15 and a hardmask 25 (which is later removed). The substrate material 15 can be either a bulk wafer of Si or any suitable semiconductor material or a semiconductor-on-insulator (SOI) substrate. In embodiments, the semiconductor material can be, but not limited to, Si, SiGe, SiGeC, SiC, GaAs, InAs, InP, and other III/V or II/VI compound semiconductors. In embodiments, the hardmask 25 can be a silicon nitride (SiN) material deposited by any conventional deposition process such as a chemical deposition (CVD) process.

In embodiments, the fin structures 20 can be formed by sidewall image transfer (SIT) techniques. In SIT techniques, for example, a mandrel, e.g., $SiO_2$, is formed on the hardmask 25, using conventional deposition processes, e.g. CVD. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 20. Spacers are formed on the sidewalls of the mandrels which are preferably material that is different than the mandrels, and which are formed using conventional deposition processes known to those of skill in the art. The spacers can have a width which matches the dimensions of the fin structures 20, for example. The mandrels are removed or stripped using a conventional etching process, selective to the mandrel material. An etching is then performed within the spacing of the spacers to form the sub-lithographic features, e.g., fin structures 20. The sidewall spacers can then be stripped.

Still referring to FIG. 1, an oxide material 30 is formed between the fin structures 20, on the substrate 15. In embodiments, the oxide material 30 is a flowable oxide material which can have a thickness of about 10 nm to 100 nm; although other dimensions are also contemplated herein. A high-k dielectric material 35 is formed on the fin structures 20, and over the oxide material 30. The high-k dielectric material 35 is a gate dielectric, e.g., a hafnium oxide based material. The high-k dielectric material 35 can be deposited using an atomic layer deposition (ALD) process to a thickness of about 1 Å to about 100 Å, depending on the technology and design parameters.

A work function metal 40 can be deposited on the high-k dielectric material 35. In embodiments, the work function metal 40 can comprise tungsten; although other metals are also contemplated herein. The work function metal 40 can be deposited by any conventional deposition process such as CVD.

Figure 2:
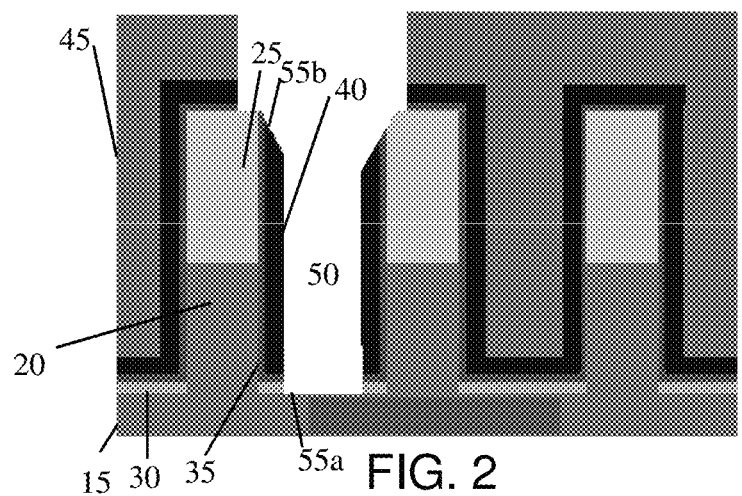
FIG. 2 shows a punch through between the vertical FETs, amongst other features, and respective fabrication processes in accordance with aspects of the present disclosure.

In FIG. 2, a photoresist 45 is applied over the work function metal 40. The photoresist 45 is exposed to energy (light) to form a pattern (opening) 50. An etching process with a selective chemistry, e.g., reactive ion etching (RIE), is used to punch through the work function metal 40 and the high-k dielectric material 35, exposing the substrate 15 as noted at reference numeral 55a. In additional, the punch through process will also provide a chamfer 55b at the corners of the fin structures 20. In embodiments, the punch through is an isotropic etching process which leaves the work function metal 40 on the sidewalls of the fin structures 20. In embodiments, the etching process can be a wet or dry etch process.

Figure 3:
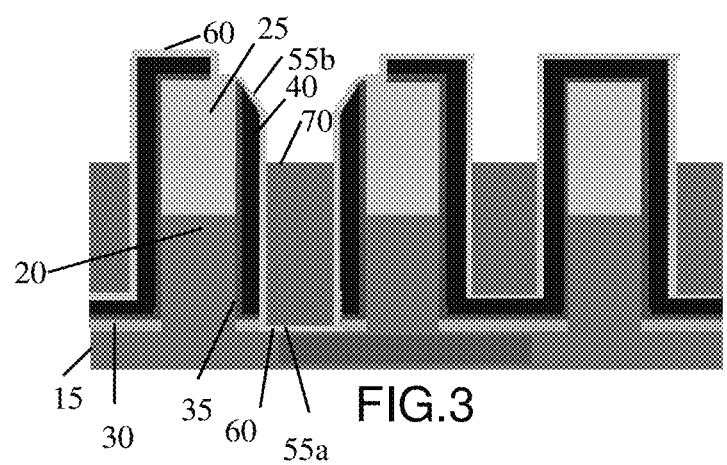
FIG. 3 shows a silicon nitride cap and recess of poly material, amongst other features, and respective fabrication processes in accordance with aspects of the present disclosure.

In FIG. 3, a liner 60 is deposited over fin structure 20 and exposed portions 55a of the substrate 15, between the fin structures 20. In embodiments, the liner 60 is SiN material, deposited by conventional deposition methods, e.g., CVD. A poly material 70 is deposited on the liner 60, which is then subjected to a chemical mechanical polishing (CMP), and thereafter recessed by conventional etching processes, e.g., reactive ion etching (RIE), selective to the poly material 70.

Figure 4:
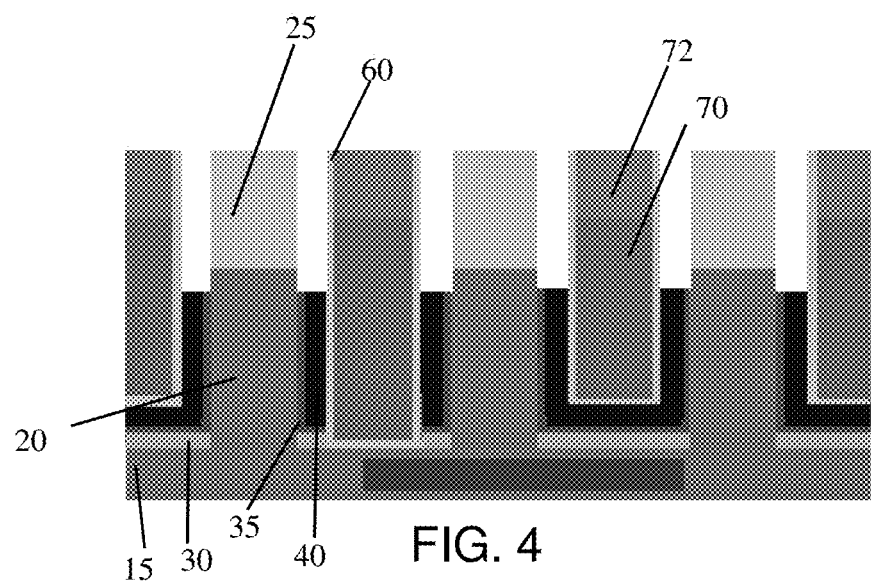
FIG. 4 shows work function metal recess, amongst other features, and respective fabrication processes in accordance with aspects of the present disclosure.

In FIG. 4, an oxide material 72 is deposited on the poly material 70, which then undergoes post oxide CMP process. The CMP process will remove an upper portion of the work function metal 40, the high-k dielectric material 35, and the liner 60. Following the CMP process, the work function metal 40 and the high-k dielectric material 35 are recessed to below the fin structures 20, and preferably below the substrate material 15 of the fin structures 20. In embodiments, the liner 60 can act as an etch stop layer during the recessing processes. In embodiments, high-k dielectric material 35 and the work function material 40 are recessed by conventional etching processes, e.g., reactive ion etching (RIE).

Figure 5:
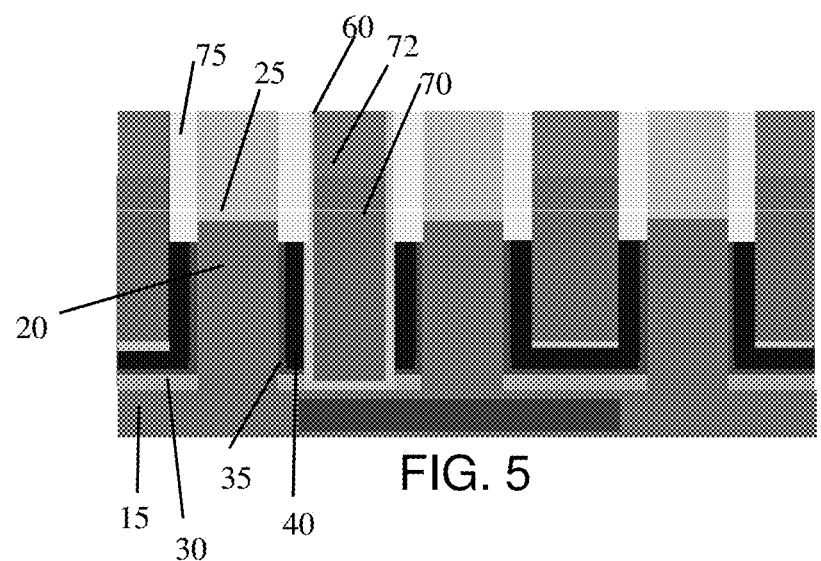
FIG. 5 shows a silicon nitride cap, amongst other features, and respective fabrication processes in accordance with aspects of the present disclosure.

In FIG. 5, capping layer 75 is formed within the recesses between the fin structures 20. In embodiments, the capping layer 75 is a silicon nitride (SiN) capping layer deposited over the recessed high-k dielectric material 35 and the recessed work function material 40. The capping layer 75 can be deposited by a CVD process, among other examples. After the deposition of the capping layer 75, a CMP process is performed to planarize the structure.

Figure 6:
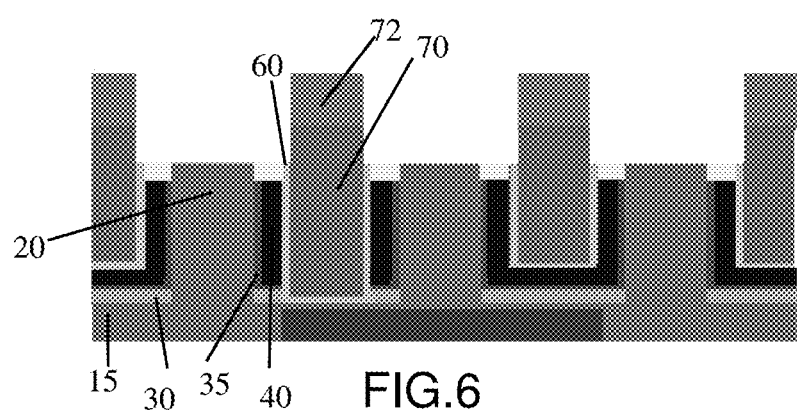
FIG. 6 shows silicon nitride recess, amongst other features, and respective fabrication processes in accordance with aspects of the present disclosure.

In FIG. 6, the liner and the capping layer 60, 75 are recessed by conventional etching processes, e.g., reactive ion etching (RIE). In addition, the hardmask 25 is removed to expose the substrate 15 of the fin structures 20. This process will expose the substrate 15 of the fin structures 20. In embodiments, the liner and the capping layer 60, 75 and the hardmask 25 can be removed/recessed simultaneously or separately, depending on the etch chemicals.

Figure 7:
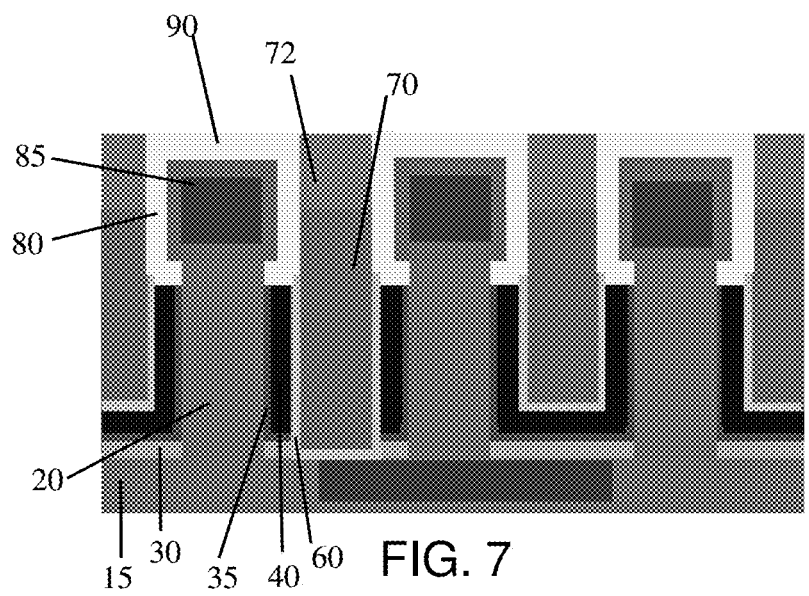
FIG. 7 shows an epitaxial layer and silicon nitride cap, amongst other features, and respective fabrication processes in accordance with aspects of the present disclosure.

In FIG. 7, a spacer 80 is deposited on sidewalls of the poly material 70 and oxide material 72. In embodiments, the spacer 80 can be silicon nitride (SiN) material deposited by a CVD process, among other examples. Following the deposition of the spacer 80, an isotropic etching is performed to remove the spacer material from any horizontal surfaces, leaving the spacer 80 on the sidewalls of the poly material 70 and the oxide material 72. The isotropic etching process will expose the surface of the substrate 15 of the fin structure 20.

Still referring to FIG. 7, an epitaxial material 85 is grown on the exposed portions of the fin structures 20. In embodiments, the epitaxial material 85 can be, e.g., Si, SiGe, SiGeC, SiC, GaAs, InAs, InP, and other semiconductor materials. As should be understood by those of ordinary skill in the art, the epitaxial material 85 will not grow on the spacer 80, thereby keeping the source and/or drain contacts electrically isolated from the gate contacts. In embodiments, the epitaxial material 85 is grown to a height below the oxide material 72.

A capping layer 90 is deposited on the epitaxial material 85. In embodiments, the capping layer 90 is a SiN material. A CMP process is then performed to remove any material of the capping layer 90 from the poly material 70. The CMP process will also provide a planarized surface.

Figure 8:
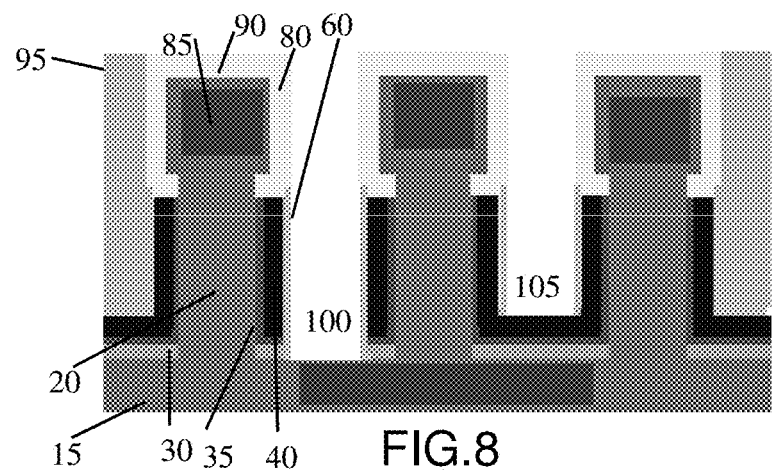
FIG. 8 shows removal of material between fin structures, amongst other features, and respective fabrication processes in accordance with aspects of the present disclosure.

As shown in FIG. 8, dielectric material 95 can be deposited on sides of the fin structures 20, using conventional lithography and deposition methods, e.g., CVD processes. In embodiments, prior to the deposition of the dielectric material 95, trenches 100, 105 are opened on the sides of the fin structures 20 by conventional lithography and etching processes to remove the oxide and poly material. Following the deposition process, a CMP process is performed to remove any dielectric material from the surfaces of the oxide layer 72. The dielectric material 95 can comprise a SiOC material; although other dielectric materials are also contemplated herein.

Still referring to FIG. 8, a dummy contact/contact to gate pull is performed to remove the oxide material 72 and the poly material 70. In embodiments, the dummy contact/contact to gate pull is a wet etch process using a single mask, to form trenches 100, 105. It should be understood, though, that the dummy contact/contact to gate pull can also be performed by a dry RIE process, with a single mask. In embodiments, the SiN materials 80 and 90 will isolate metal contacts 110 from the fin structures and more particularly from the work function metal 40 of the gate structures. The trench 100 exposes the underlying substrate 15; whereas, the trench 105 exposes the work function metal 40. Also, the SiN material will remain on the sidewalls of the workfunction metals 40 of the gate structures.

Figure 9:
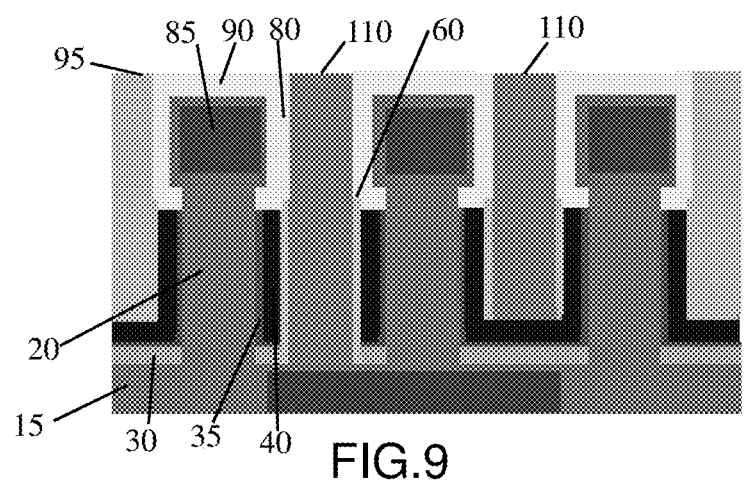
FIG. 9 shows metal contact fill, amongst other features, and respective fabrication processes in accordance with aspects of the present disclosure.

In FIG. 9, a metal 110 fills the trenches 100, 105 on the sides of the respective fin structures 20. In embodiments, the SiN materials 80 and 90 will isolate the metal contacts 110 from the fin structures and more particularly from the work function metal 40 of the gate structures. The metal 110 can be tungsten or other metal contact material. A CMP is then performed, stopping on the SiN capping layer 90. In embodiments described herein, only one mask has been used in order to create a contact on gate height and a source or drain contact.

In FIG. 9, a structure can include a plurality of fin structures 20, a first contact landing on a substrate 15 between a first set of fin structures of the plurality of fin structures 20, sidewalls of the first contact being in direct contact with a liner 60 (e.g., an insulator material) of the first set of the fin structures, and a second contact landing on a work function metal 40 between a second set of fin structures of the plurality of fin structures 20, sidewalls of the second contact being in direct contact with the liner 60 (e.g., insulator material) of the second set of the fin structures.

In FIG. 9, the work function metal 40 is provided between the liner 60 (e.g., insulator material) and the sidewalls of the first set of fin structures. The plurality of fin structures 20 includes the substrate 15 and an epitaxial material 85 on the substrate 15. Further, the liner 60 (e.g., insulator material) is below the epitaxial material 85. The first contact extends through an oxide layer 30 on the substrate 15.

In FIG. 9, a capping layer 90 is on the epitaxial material 85. A gate dielectric material 95 is on the sidewalls of the first set of fin structures in direct contact with the work function metal 40 and the substrate 15. Further, the work function metal 40 is provided between the liner 60 (e.g., insulator material) and the sidewalls of the second set of fin structures and extends below the epitaxial material 85.

In FIG. 9, the gate dielectric material 95 is also on the sidewalls of the second set of fin structures and below the work function metal 40 which is below the second contact. An oxide layer 30 is below the work function metal 40 of the second set of fin structures and the second contact. Lastly, the first contact is a source or drain contact and the second contact is a gate contact for vertically oriented gate structures comprising the plurality of fin structures 20.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of fin structures;
   a first contact landing on a substrate material between a first set of fin structures of the plurality of fin structures, sidewalls of the first contact being in direct contact with an insulator material of the first set of the fin structures; and
   a second contact landing on a work function material between a second set of fin structures of the plurality of fin structures, sidewalls of the second contact being in direct contact with the insulator material of the second set of the fin structures.

2. The structure of claim 1, wherein the work function material is further provided between the insulator material and the sidewalls of the first set of fin structures.

3. The structure of claim 2, wherein the plurality of fin structures comprise substrate material and an epitaxially grown material on the substrate material.

4. The structure of claim 3, wherein the insulator material is below the epitaxially grown material.

5. The structure of claim 3, wherein the first contact extends through an oxide layer on the substrate material, between the first set of fin structures.

6. The structure of claim 5, further comprising a capping material on the epitaxially grown material.

7. The structure of claim 5, further comprising a gate dielectric material on sidewalls of the first set of fin structures in direct contact with the work function material and the substrate material.

8. The structure of claim 1, wherein the work function material is provided between the insulator material and sidewalls of the second set of fin structures and extends below an epitaxially grown material, partly forming the second set of fin structures.

9. The structure of claim 8, wherein the insulator material is below the epitaxially grown material.

10. The structure of claim 9, further comprising a capping material on the epitaxially grown material.

11. The structure of claim 8, further comprising a gate dielectric material on the sidewalls of the second set of fin structures and below the work function material.

12. The structure of claim 8, further comprising an oxide layer below the work function material of the second set of fin structures and the second contact.

13. The structure of claim 1, wherein the first contact is a source or drain contact and the second contact is a gate contact for vertically oriented gate structures comprising the plurality of fin structures.

14. A structure, comprising:
   a plurality of fin structures comprising a substrate material and an epitaxially grown material on the substrate material;
   a source or drain contact landing on the substrate material between a first set of fin structures of the plurality of fin structures;
   a gate contact landing on a work function material between a second set of fin structures of the plurality of fin structures; and
   an insulator material in direct contact with the source or drain contact and the first set of fin structures and the gate contact and the second set of fin structures.

15. The structure of claim 14, wherein the insulator material is below the epitaxially grown material.

16. The structure of claim 14, further comprising a capping material on the epitaxially grown material.

17. The structure of claim 14, wherein the work function material is provided between the insulator material and sidewalls of the first set of fin structures, and between the insulator material and sidewalls of the second set of fin structures.

18. The structure of claim 17, further comprising a gate dielectric material on the sidewalls of the first set of fin structures in direct contact with the work function material and the substrate material, or where the gate dielectric material is on the sidewalls of the second set of fin structures and below the work function material which is below the gate contact.

19. A method, comprising:
   forming a plurality of vertical fin structures;
   forming a first contact landing on a substrate material between a first set of fin structures of the plurality of vertical fin structures, sidewalls of the first contact being in direct contact with an insulator material of the first set of the fin structures; and
   forming a second contact landing on a work function material between a second set of fin structures of the plurality of vertical fin structures, sidewalls of the second contact being in direct contact with the insulator material of the second set of the fin structures.

20. The method of claim 19, wherein the first contact is a source or drain contact and the second contact is a gate contact for vertically oriented gate structures comprising the plurality of vertical fin structures.

* * * * *